(12) United States Patent
Sadaka et al.

(10) Patent No.: US 7,560,318 B2
(45) Date of Patent: Jul. 14, 2009

(54) PROCESS FOR FORMING AN ELECTRONIC DEVICE INCLUDING SEMICONDUCTOR LAYERS HAVING DIFFERENT STRESSES

(75) Inventors: Mariam G. Sadaka, Austin, TX (US); Venkat R. Kolagunta, Austin, TX (US); William J. Taylor, Austin, TX (US); Victor H. Vartanian, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 253 days.

(21) Appl. No.: 11/374,372

(22) Filed: Mar. 13, 2006

(65) Prior Publication Data

US 2007/0210381 A1    Sep. 13, 2007

(51) Int. Cl.
*H01L 21/84*    (2006.01)

(52) U.S. Cl. .............. 438/151; 438/285; 257/E21.561

(58) Field of Classification Search ......... 438/151–166, 438/285; 257/E21.561
See application file for complete search history.

(56) References Cited

U.S. PATENT DOCUMENTS

| 4,549,064 | A  | 10/1985 | Delfino |
| 5,166,084 | A  | 11/1992 | Pfiester et al. |
| 7,030,428 | B2 | 4/2006  | Saxler |
| 7,135,392 | B1 | 11/2006 | Adams et al. |
| 7,145,219 | B2 | 12/2006 | Faris |
| 7,161,194 | B2 | 1/2007  | Parikh et al. |
| 7,223,647 | B2 | 5/2007  | Hsu et al. |
| 7,316,960 | B2 | 1/2008  | Ting |
| 2004/0175872 | A1 | 9/2004 | Yeo et al. |
| 2004/0224469 | A1 | 11/2004 | Lim et al. |
| 2005/0124146 | A1 | 6/2005 | Bedell et al. |
| 2005/0233514 | A1 | 10/2005 | Bu et al. |
| 2005/0255667 | A1 | 11/2005 | Arghavani et al. |
| 2005/0258515 | A1 | 11/2005 | Chidambarrao et al. |
| 2005/0266639 | A1 | 12/2005 | Frohberg et al. |
| 2006/0014366 | A1 | 1/2006 | Currie et al. |
| 2006/0017138 | A1 | 1/2006 | Ting |
| 2006/0071285 | A1 | 4/2006 | Dafta et al. |
| 2006/0131268 | A1 | 6/2006 | Mikhaylichenko et al. |
| 2006/0134899 | A1 | 6/2006 | Wu et al. |

(Continued)

OTHER PUBLICATIONS

Chen et al.; "Stress memorization technique (SMT) by Selectively Strained-Nitride Capping for Sub-65nm High Performance Strained-Si Device Application" 2004 Symposium on VLSI Technology Digest of Technical Papers pp. 56-57.

(Continued)

*Primary Examiner*—Richard A. Booth

(57) ABSTRACT

An electronic device can have an insulating layer lying between a first semiconductor layer and a base layer. A second semiconductor layer, having a different composition and stress as compared to the first semiconductor layer, can overlie at least a portion of the first semiconductor layer. In one embodiment, a first electronic component can include a first active region that includes a first portion of the first and the second semiconductor layers. A second electronic component can include a second active region that can include a second portion of the first semiconductor layer. Different processes can be used to form the electronic device. In another embodiment, annealing a workpiece can be performed and the stress of at least one of the semiconductor layers can be changed. In a different embodiment, annealing the workpiece can be performed either before or after the formation of the second semiconductor layer.

20 Claims, 3 Drawing Sheets

U.S. PATENT DOCUMENTS

| | | |
|---|---|---|
| 2006/0141687 A1 | 6/2006 | Bhattacharyya |
| 2006/0223255 A1 | 10/2006 | Chen et al. |
| 2006/0223290 A1 | 10/2006 | Belyansky et al. |
| 2006/0228897 A1 | 10/2006 | Timans |
| 2007/0141775 A1 | 6/2007 | Teo et al. |
| 2007/0148336 A1 | 6/2007 | Bachrach et al. |
| 2007/0190741 A1 | 8/2007 | Lindsay |
| 2007/0281405 A1 | 12/2007 | Luo et al. |

OTHER PUBLICATIONS

Mishima et al.; "Ultra-thin Strained Si on Insulator Substrate Using Laser Annealing" 2005 IEEE International SOI Conference pp. 141-143.

International Search Report and Written Opinion for correlating PCT Patent Application No. PCT/US07/62537 dated Aug. 11, 2008.

PROCESS FOR FORMING AN ELECTRONIC DEVICE INCLUDING SEMICONDUCTOR LAYERS HAVING DIFFERENT STRESSES

BACKGROUND

1. Field of the Disclosure

The present disclosure relates to electronic devices, more particularly, to forming electronic devices with regions of different stresses and material compositions.

2. Description of the Related Art

Carrier mobility within an electronic component (e.g. a transistor) of an electronic device can be affected by the properties of the material from which the electronic component is formed. Such properties can include material composition, stress, crystal orientation, or any combination thereof. A change that improves the mobility for one carrier type can be detrimental to the mobility of a carrier of an opposing carrier type. Thus, in complementary metal-oxide semiconductor ("CMOS") electronic devices, active regions having different sets of material properties may be used One proposed method of achieving different sets of material properties can include epitaxially growing a first layer of 120 nm or thicker silicon germanium ("$Si_{(x)}Ge_{(1-x)}$") on a silicon wafer and annealing the silicon wafer to relax the stress in the first layer. A second layer of silicon formed over the relaxed $Si_{(x)}Ge_{(1-x)}$ can then have a tensile stress. Annealing a stressed film, such as the first layer, can cause surface roughening, dislocation defects within the film, or any combination thereof. Such a process could require additional processing, such as chemical mechanical polishing ("CMP") of the surface or formation of additional $Si_{(x)}Ge_{(1-x)}$ to form a layer of sufficient quality to form a semiconductor component.

Another method can be to form a first graded layer of $Si_{(x)}Ge_{(1-x)}$ such that x can be close to 1 when formation of the layer begins, and gradually decrease as the layer thickens such that dislocation formation can be minimized. Once the desired concentration is reached, a thickness of relatively defect-free $Si_{(x)}Ge_{(1-x)}$ can be formed, and a stressed silicon layer can be formed over the first graded layer. Such a layer can then be transferred to another wafer by a wafer bonding and cleaving process. The stress in a film like the first graded layer can cause hillocks or surface roughening during the formation of the semiconductor layers or subsequent processing, possibly requiring a CMP process be performed on $Si_{(x)}Ge_{(1-x)}$ in order to facilitate the wafer bonding process.

BRIEF DESCRIPTION OF THE DRAWINGS

The present disclosure may be better understood, and its numerous features and advantages made apparent to those skilled in the art by referencing the accompanying drawings. The subject of the disclosure is illustrated by way of example and not limitation in the accompanying figures.

Figure 1:
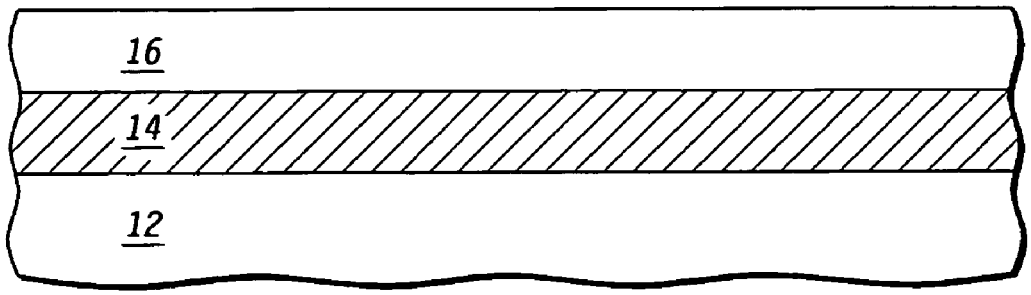
FIG. 1 includes an illustration of a cross-sectional view of a workpiece where one or more electronic components of an electronic device can be formed.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention. The use of the same reference symbols in different drawings indicates similar or identical items.

DETAILED DESCRIPTION

An electronic device can have an insulating layer lying between a first semiconductor layer and a base layer. A second semiconductor layer, having a different composition and stress as compared to the first semiconductor layer, can overlie at least a portion of the first semiconductor layer. In one aspect, a first electronic component can include a first active region that includes a first portion of the first and the second semiconductor layers. A second electronic component can include a second active region that can include a second portion of the first semiconductor layer. In accordance with a specific embodiment, the stress within a channel region of the first electronic component and the stress within a channel region of the second electronic component can be different.

Different processes can be used to form the electronic device. In another aspect, a process of forming an electronic device can comprise providing a workpiece. The workpiece can include a first semiconductor layer, an insulating layer, and a base layer. The insulating layer can lie between the first semiconductor layer and the base layer. The first semiconductor layer has a first stress, the first stress having a first magnitude and a first type. The process can also include forming a second semiconductor layer over the first semiconductor layer, wherein the second semiconductor layer has a second stress, the second stress having a second magnitude and a second type. The process can further include annealing the workpiece such that the second semiconductor layer has a third stress, the third stress having a third magnitude and a third type. The third magnitude can be different than the second magnitude. In a particular embodiment, the third magnitude can be smaller than the second magnitude. The process can also include removing at least a portion of the second semiconductor layer to expose a portion of the first semiconductor layer. After removing the at least a portion of the second semiconductor layer, the first semiconductor layer has a fourth stress, the fourth stress having a fourth magnitude and a fourth type. The fourth stress has an opposite type as compared to the second stress.

In yet another aspect, a process of forming an electronic device can include providing a workpiece, wherein the workpiece can include a first semiconductor layer, an insulating layer, and a base layer. The insulating layer can lie between the first semiconductor layer and the base layer. The first semiconductor layer can have a first stress, the first stress having a first magnitude and a first type. The process can also include annealing the workpiece such that the first semiconductor layer has a second stress, the second stress having a second magnitude and a second type. The second magnitude can be different than the first magnitude. In a particular embodiment, the second magnitude can be smaller than the second magnitude. The process can further include forming a second semiconductor layer overlying the first semiconductor layer, wherein the second semiconductor layer can have a third stress the third stress can have a third magnitude and a third type. The third stress can have an opposite type as compared to the first stress.

An electronic device can include channel regions with different stresses, and thus carrier mobility in the individual channel regions can be affected. Specific embodiments of the present disclosure will be better understood with reference to FIGS. 1 through 8.

Some terms are defined or clarified as to their intended meaning as they are used within this specification. The term "active region" is intended to mean a portion of an electronic component through which charge carriers can flow during normal operation of the electronic component. An example of an active region can include source/drain and channel regions of a transistor structure or a resistive portion between terminals of a resistor.

The term "critical thickness" is a thickness beyond which dislocations or other defects will form to relieve stress in a layer. For example a $Si_{(0.55)}Ge_{(0.45)}$, layer formed on a monocrystaline silicon substrate can have a stress of approximately 2.5 to approximately 3.5 GPa and critical thickness between 5 and 10 nm, The term "spatial ordering" is intended to mean the physical arrangement of material within a solid. An example of spatial ordering is a lattice of a crystalline material. However, non-crystalline materials (e.g. glasses, some metal alloys) can also have spatial ordering. Both temperature and externally applied forces can affect spatial ordering of a material.

The term "workpiece" is intended to mean a substrate and, if any, one or more layers one or more structures, or any combination thereof attached to the substrate, at any particular point of a process sequence. Note that the substrate may not significantly change during a process sequence, whereas the workpiece significantly changes during the process sequence. For example, at the beginning of a process sequence, the substrate and workpiece are the same. After a layer is formed over the substrate, the substrate has not changed, but now the workpiece includes the combination of the substrate and the layer.

Unless stated otherwise, the stress of a layer is measured at room temperature (approximately 25° C.) after formation of the layer and before a subsequent heat cycle that is greater than 100° C. As used herein, a stress has a magnitude (or distance from a zero value) and a type (either compressive or tensile).

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

Additionally, for clarity purposes and to give a general sense of the scope of the embodiments described herein, the use of the "a" or "an" are employed to describe one or more articles to which "a" or "an" refers. Therefore, the description should be read to include one or at least one whenever "a" or "an" is used, and the singular also includes the plural unless it is clear that the contrary is meant otherwise.

Unless otherwise defined, all technical and scientific terms used herein have the same meaning as commonly understood by one of ordinary skill in the art to which this invention belongs. All publications, patent applications, patents, and other references mentioned herein are incorporated by reference in their entirety. In case of conflict, the present specification, including definitions, will control. In addition, the materials, methods, and examples are illustrative only and not intended to be limiting.

FIG. 1 includes an illustration of a cross-sectional view of a portion of a workpiece 10 where one or more electronic components of an electronic device can subsequently be formed. The workpiece 10 can include a base layer 12, an insulating layer 14, and a semiconductor layer 16. In the illustrated embodiment, the base layer 12 can be a support layer and provide mechanical support for the other layers of the workpiece. For example, the base layer 12 can include an insulating material typically used in manufacturing semiconductor devices such as quartz, glass, plastic, or any combination thereof. In another embodiment, the base layer 12 can include a semiconductor material including a semiconductor element, such as silicon, germanium, carbon, gallium, arsenic, or any combination thereof.

The insulating layer 14 can be a buried insulating layer and provide electrical insulation between the base layer 12 and the semiconductor layer 16. The insulating layer 14 can be grown, deposited, or otherwise formed by conventional or proprietary processing. The insulating layer 14 can have a thickness in a range of approximately 10 to approximately 500 nm. The insulating layer 14 can include an oxide, a nitride, an oxynitride, or any combination thereof. The semiconductor layer 16 can be grown, deposited, otherwise formed, or bonded by a conventional or proprietary technique. The semiconductor layer 16 can include a semiconductor element such as silicon, germanium, carbon, or any combination thereof and have a substantially uniform thickness in a range of approximately 15 to approximately 150 nm. The semiconductor layer 16 can have a first stress. The semiconductor layer 16 can be doped with a p-type dopant, an n-type dopant, or any combination thereof and have a dopant concentration in a range of approximately 1E14 to approximately 1E19 atoms per cubic centimeter. In a particular embodiment, the semiconductor layer 16 can include a silicon layer. The first stress can have a magnitude less than approximately 10 MPa and a type that is tensile or compressive. Although not illustrated, field isolation regions may also be formed at this time.

Figure 2:
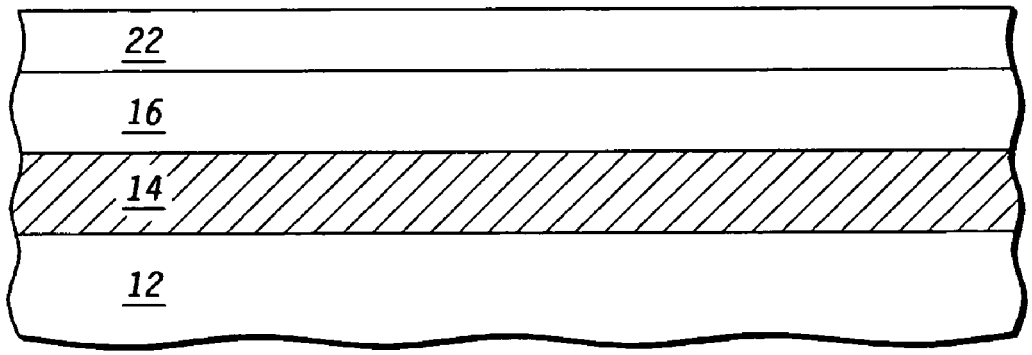
FIG. 2 includes an illustration of a cross-sectional view of the workpiece of FIG. 1 after formation of an overlying semiconductor layer.

FIG. 2 includes an illustration of a cross-sectional view of the workpiece 10 after forming a semiconductor layer 22 overlying the semiconductor layer 16. The semiconductor layer 22 can be grown, deposited, or otherwise formed by a conventional or proprietary process. In one embodiment, the semiconductor layer 22 can be epitaxially grown. The semiconductor layer 22 can have a thickness in a range of approximately 5 to approximately 100 nm. In one embodiment, the semiconductor layer 22 can be formed immediately adjacent to the semiconductor layer 16. In another embodiment, the semiconductor layer 22 can include one or more semiconductor materials different from the semiconductor layer 16. In another embodiment, the semiconductor layer 16 can include one or more semiconductor materials different from the semiconductor layer 22. For example, one of the semiconductor layers 16 or 22 could be monocrystalline silicon, and the other of semiconductor layers 22 or 16 could be $Si_{(x)}Ge_{(1-x)}$ where x can be in a range of approximately 0.1 to less than 1.0. In an alternative embodiment, the semiconductor layer 22 can comprise $Si_{(x)}C_{(1-x)}$ where x is in a range of approximately 0.1 to less than 1.0. In a particular embodiment, the semiconductor layer 16 can comprise a plurality of semiconductor elements, and the semiconductor layer 22 can comprise a silicon layer and be n-doped, p-doped, substantially undoped, or any combination thereof.

A mismatch of one or more of the material properties of the semiconductor layers 16 and 22 can result in a stress within the semiconductor layer 22. For example, a material may have a first spatial ordering at a temperature, and a second spatial ordering at a different temperature. Such a difference can be described by a thermal expansion coefficient. The change in spatial ordering over a temperature range may be different for different materials. Thus, a change in temperature of the workpiece 10 can result in a stress within one or both of semiconductor layers 16 and 22. In other examples, differences in spatial ordering may not depend on temperature changes.

In a particular embodiment, the material of the semiconductor layer 16 can have a lattice constant of a different size than the material of the semiconductor layer 22. In such a case, epitaxially growing the semiconductor layer 22 immediately adjacent to the semiconductor layer 16 can create a stress within one or both of the semiconductor layer 16 and 22. In one embodiment, the material with the smaller lattice size can have a tensile type of stress. In another embodiment the material with the larger lattice size can have a compressive type of stress. In one embodiment, the semiconductor layer 22 does not exceed a critical thickness with respect to the mismatch of material properties with layer 16, such that the surface of the semiconductor layer 22 can remain substantially the same with respect to defects as before the anneal process is performed. In a particular embodiment, the stress for the semiconductor layer 22 can have a magnitude in a range of approximately 1.0 to approximately 3.5 GPa and be compressive, and have a thickness in a range of approximately 5 to approximately 50 nm.

Figure 3:
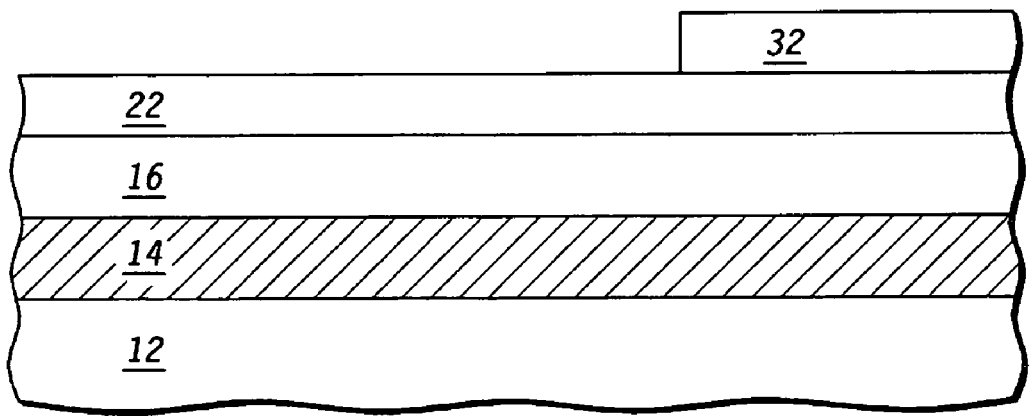
FIG. 3 includes an illustration of a cross-sectional view of the workpiece of FIG. 2 after formation of a sacrificial layer.

FIG. 3 includes an illustration of a cross-sectional view of the workpiece 10 of FIG. 2 after formation of a sacrificial layer 32. The sacrificial layer 32 can be formed overlying the semiconductor layer 22. The sacrificial layer 32 can be a material selected to substantially prevent exposure of underlying layers to radiation during subsequent processing. The sacrificial layer 32 can be an oxide, a nitride, an oxynitride, or any combination thereof. The sacrificial layer 32 can have a thickness in a range of approximately 10 to approximately 100 nm. The sacrificial layer 32 can be formed and patterned using a conventional or proprietary process. In one embodiment, the sacrificial layer 32 can be grown or deposited prior to patterning. The remaining portion of the sacrificial layer 32 can act as a hard mask during a subsequent anneal process.

Figure 4:
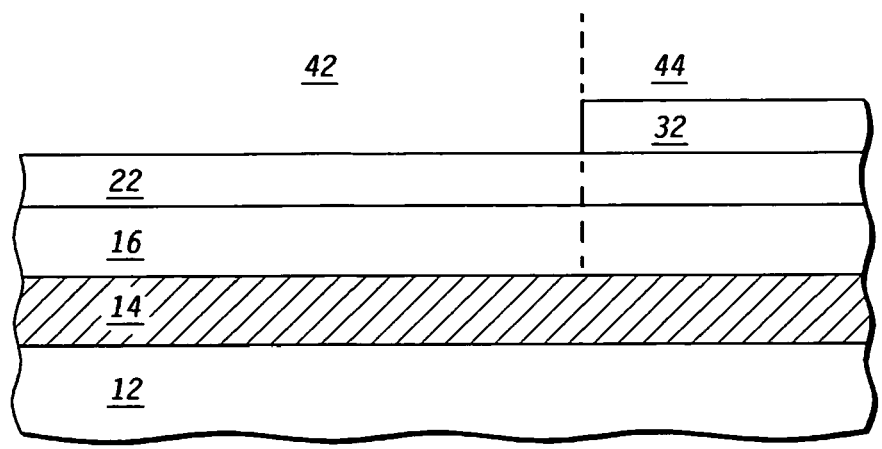
FIG. 4 includes an illustration of a cross-sectional view of the workpiece of FIG. 3 after exposing a region to radiation.

FIG. 4 includes an illustration of a cross-sectional view of the workpiece 10 of FIG. 3 after annealing the workpiece 10 using a conventional or proprietary process to form a radiation region 42 and a radiation-protected region 44. In one embodiment, annealing the workpiece 10 can utilize a directional radiation source, such as a laser source. In another embodiment, annealing the workpiece 10 can be performed using a rapid thermal process or anneal. Annealing the workpiece 10 can be performed in the presence of a substantially unreactive gas such as nitrogen, helium, argon, another noble gas, or any combination thereof.

The material composition within each of the semiconductor layer 16 and the semiconductor layer 22 can remain substantially unchanged by annealing the workpiece 10. However, the portion of the semiconductor layers 16 and 22 within the radiation region 42 can have a different stress after annealing the workpiece 10 than before. In one embodiment, the semiconductor layer 22 can have a stress with a magnitude less than 10 MPa and be either tensile or compressive within the radiation region 42. In another embodiment, the semiconductor layer 16 can have a tensile stress of greater than 10 MPa within the radiation-protected region 44.

The remaining portion of sacrificial layer 32 can be removed from the workpiece 10. In a particular embodiment, radiation can be directed to only the radiation region 42 of the workpiece 10. In such a case, forming a hard mask, like sacrificial layer 32, may not be required. In another particular embodiment, sacrificial layer 32 may not formed prior to annealing the workpiece 10 such that substantially all of the semiconductor layers 16 and 22 can be exposed to radiation during processing.

Figure 5:
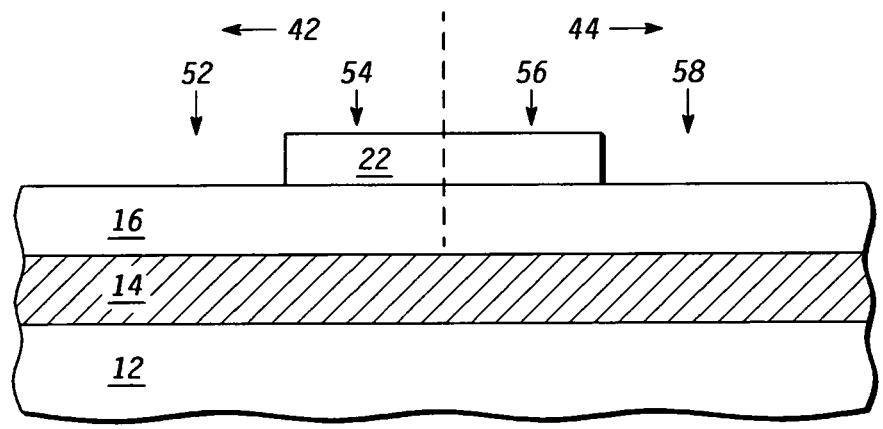
FIG. 5 includes an illustration of a cross-sectional view of the workpiece of FIG. 4 after removal of a portion of a semiconductor layer.

FIG. 5 includes an illustration of a cross-sectional view of the workpiece 10 after removal of a portion of the semiconductor layer 22. The locations 52 and 54 lie within the radiation region 42 and the locations 56 and 58 lie within the radiation-protected region 44. The semiconductor layer 22 can be patterned and etched using a conventional or proprietary process. In one embodiment, exposed material from the semiconductor layer 22 can be removed selectively to the semiconductor layer 16.

The exposed portions of the semiconductor layer 16 at the locations 52 and 58 can have different stresses. In one embodiment, the stress at location 52 can be tensile and greater in magnitude than the stress at location 58. In another embodiment, the stress at location 52 can be compressive and greater in magnitude than the stress at location 58. The remaining portion of the semiconductor layer 22 at the locations 54 and 56 can have different stresses. In one embodiment, the stress at location 56 can be compressive and greater in magnitude than the stress at location 54. In another embodiment, the stress at location 56 can be tensile and greater in magnitude than the stress at location 54.

Figure 6:
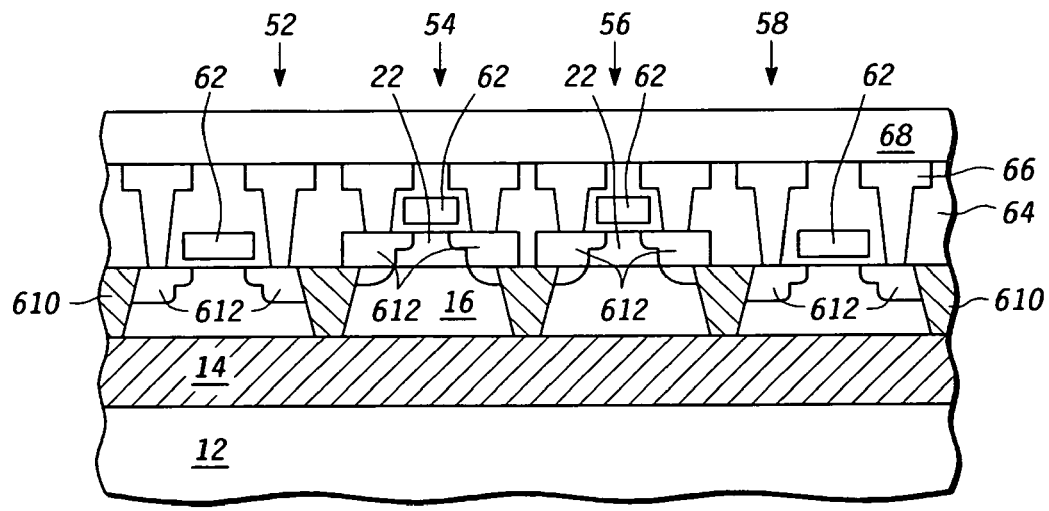
FIG. 6 includes an illustration of a cross-sectional view of the workpiece of FIG. 5 after substantial completion of the electronic device.

FIG. 6 includes an illustration of a cross-sectional view of a substantially completed electronic device. An electronic component can be formed at each of the locations 52, 54, 56, 58, or any combination thereof. In the illustrated embodiment, the electronic components at locations 52 and 58 can each be formed comprising a portion of semiconductor layer 16 having a different stress. In a further embodiment, the semiconductor layer 16 can be doped silicon and have a stress with a magnitude greater than 10 MPa with a tensile type at location 52, and a stress with a magnitude less than 10 MPa and either a tensile or compressive type at location 58. Thus, a component at location 52 can have improved hole (or degraded electron) mobility over a similar device formed at location 58.

Also in the illustrated embodiment, the electronic components at the locations 54 and 56 can each be formed comprising a portion of the semiconductor layer 22 having a different stress. In a further embodiment, the semiconductor layer 22 can be $Si_{(x)}Ge_{(1-x)}$ and have a stress with a magnitude less than 10 MPa and either a tensile or compressive type at the location 54, and a stress with a magnitude greater than 10 MPa with a compressive type at the location 56. Thus a component at location 54 can have improved hole (or degraded electron) mobility over a similar device formed at location 56.

Although illustrated as planar device structures, skilled artisans will be appreciated that fin-type structures, or a mixture of fin-type and planar structures can also be formed at the locations 52, 54, 56, 58, or any combination thereof. One or more gate dielectric layers, one or more gate electrodes 62, one or more source regions, drain regions, source/drain regions 612 or any combination thereof can be formed using a conventional or proprietary process. One or more insulating layers 64, one or more conductive layers 66, and one or more encapsulating layers 68 are formed using one or more conventional or proprietary techniques. Also illustrated are previously formed field isolation regions 610.

In a particular embodiment, the semiconductor layer 16 can comprise monocrystalline silicon and the semiconductor layer 22 can comprise a $Si_{(0.65)}Ge_{(0.35)}$. An electronic component, such as an n-channel transistor, at location 52 can have a channel region within a p-doped region with a tensile type stress with a magnitude in a range of approximately 1.0 to approximately 3.5 GPa. An electronic component, such as an n-channel transistor or a p-channel transistor, at location 54 can have a channel region within either an n-doped or a p-doped region with either a tensile or a compressive type stress with a magnitude less than approximately 10 MPa. An electronic component, such as a p-channel transistor, at location 56 can have a channel region within an n-doped region with a compressive type stress in a range of approximately 1.0 to approximately 3.5 GPa. An electronic component, such as an n-channel or p-channel transistor, at location 58 can have a channel region within either an n-doped or a p-doped region with either a tensile or compressive type stress with a magnitude less than approximately 10 MPa.

Figure 7:
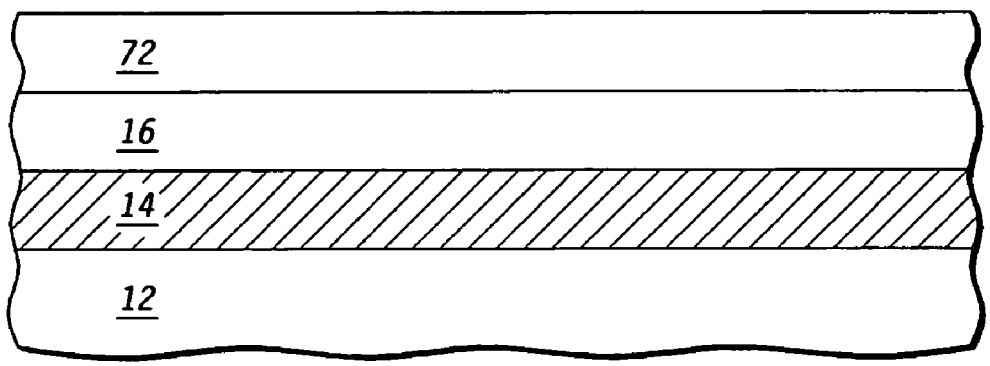
FIG. 7 includes an illustration of a cross-sectional view of the workpiece of FIG. 1 after formation of a semiconductor layer according to an alternative embodiment.

In an alternative embodiment, an electronic device can include one or more layers with a different composition, stress or any combination thereof. FIG. 7 includes an illustration of the workpiece 20 of FIG. 1 after formation of a layer 72. The layer 72 can provide an element that can diffuse or otherwise migrate into the semiconductor layer 16, and can include a material, such as silicon carbon, oxygen, germanium, or any combination thereof. The semiconductor layer 16 can have a stress having a magnitude of less than approximately 10 MPa and a type that is either tensile or compressive. The layer 72 can be grown, deposited or formed over the semiconductor layer 16 by a conventional or proprietary technique. The layer 72 can include the element and have a stress having a magnitude of approximately 10 MPa or greater and, in one embodiment can have a compressive type. In another embodiment, the element can be carbon, germanium, another semiconductor element, or any combination thereof. The layer 72 can have a thickness in a range of approximately 5 to approximately 200 nm. A concentration of the element in layer 72 can be higher than a concentration of the element in semiconductor layer 16. In one embodiment, the concentration of the element in the semiconductor layer 16 can be substantially equal to zero.

The workpiece 20 can be heated such that a portion of the element from the layer 72 can diffuse or otherwise migrate into the semiconductor layer 16 to form the semiconductor layer 74. The semiconductor layer 74 can have a different concentration of the element, as compared to the semiconductor layer 16, and the different concentration can be larger than the concentration of the element within the semiconductor layer 16. In one embodiment, the workpiece 20 can be heated in a reactive environment, such an oxidizing or nitridizing environment, or the workpiece 20 can be heated in a substantially non-reacting environment, such an environment including nitrogen, helium, argon, another noble gas, or any combination thereof. The layer 72 can then be removed from the workpiece 20.

The semiconductor layer 74 can have a stress with a magnitude greater than approximately 10 MPa and a type that can be either compressive or tensile, depending on the element transferred between the layer 72 and the semiconductor layer 74. The semiconductor layer 74 can have a composition that includes the element at the different concentration. In one embodiment, the semiconductor layer 74 can comprise a compressively stressed silicon germanium layer with a stress in a range of approximately 1.0 to approximately 3.5 GPa and a germanium composition in a range previously discussed with respect for FIG. 2. Annealing the workpiece 20 can be performed on the workpiece 20 using an embodiment described with respect to the workpiece 10 in FIG. 4 such that the semiconductor layer 74 can substantially maintain the different concentration of the element and have a stress with a magnitude less than approximately 10 MPa of either a tensile or compressive type.

Figure 8:
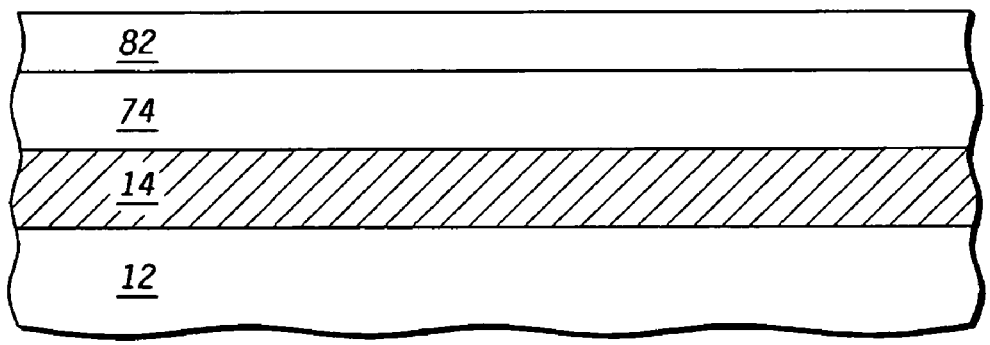
FIG. 8 includes an illustration of a cross-sectional view of the workpiece of FIG. 7 after formation of a semiconductor layer.

FIG. 8 includes an illustration of a cross-sectional view of the workpiece 20 of FIG. 7 after formation of a semiconductor layer 82. The semiconductor layer 82 can have a thickness in a range of approximately 5 to approximately 100 nm and include a semiconductor material. The semiconductor layer 82 can have a different composition from the semiconductor layer 74. A mismatch in material properties between the semiconductor layer 82 and the semiconductor layer 74 can result in the semiconductor layer 82 having a stress. In one embodiment the stress can be a tensile with a magnitude greater than or equal to approximately 10 MPa. In other embodiments the stress can have a compressive type.

Figure 9:
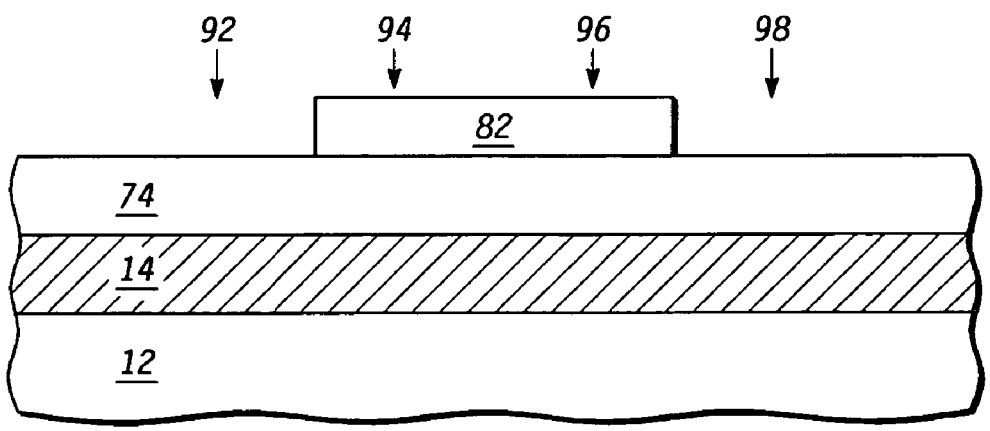
FIG. 9 includes an illustration of a cross-section of the workpiece of FIG. 8 after removal of a portion of a semiconductor layer.

FIG. 9 includes an illustration of a cross-sectional view of the workpiece 20 of FIG. 8 after removal of a portion of the semiconductor layer 82. The locations 92, 94, 96, and 98 are locations where an electronic component can be formed. In a particular embodiment, the semiconductor layer 16 can comprise $Si_{(0.65)}Ge_{(0.35)}$ and the stress can have a magnitude less than 10 MPa, and the semiconductor layer 82 can comprise epitaxially grown silicon and the stress can be tensile and have a magnitude in a range of approximately 2.5 to approximately 3.5 GPa. In another embodiment, the semiconductor layers 74 and 82 can have different compositions, stresses or any combination thereof unless otherwise proscribe herein.

As previously described with respect to FIG. 6, processing can continue to form a substantially complete electronic device. The location 52, 54, 56, and 58 of the workpiece 10 can correspond to locations 92, 94, 96, and 98 of the workpiece 20. The semiconductor layer 16 of the workpiece 10 can correspond to the semiconductor layer 74 of the workpiece 20. The semiconductor layer 22 of the workpiece 10 can correspond to the semiconductor layer 82 of the workpiece 20. An electronic component at the location 52 or the location 58 can have a channel region within an n-doped region with a stress of less than approximately 10 MPa in magnitude. An electronic component formed at the location 54 or the location 56 can have a channel region formed in a p-doped region with a stress in a range of approximately 2.5 to approximately 3.5 GPa. Formation of the remainder of the electronic device can proceed according to an embodiment previously described with respect to FIG. 6.

By forming a semiconductor layer at less than a critical thickness overlying another semiconductor layer, a materials mismatch can be exploited in forming channel regions having stresses and material types tailored for a particular electronic device. Limiting the thickness of the overlying layer can introduce fewer defects and reduce the need for performing some additional processes. Channel regions closer in elevation can reduce the complexity of lithography and etch processing.

Many different aspects and embodiments are possible. Some of those aspects and embodiments are described below. After reading this specification, skilled artisans will appreciate that those aspects and embodiments are only illustrative and do not limit the scope of the present invention.

In a first aspect, a process of forming an electronic device can include providing a workpiece. The workpiece can include a first semiconductor layer, an insulating layer, and a base layer. The insulating layer can lie between the first semiconductor layer and the base layer, and the first semiconductor layer has a first stress, the first stress having a first magnitude and a first type. The process can also include forming a second semiconductor layer over the first semiconductor layer, wherein the second semiconductor layer has a second stress, the second stress having a second magnitude and a second type. The process can further include annealing the workpiece such that the second semiconductor layer has a third stress, the third stress having a third magnitude and a third type, wherein the third magnitude is different than the second magnitude. The process can still further include removing at least a portion of the second semiconductor layer to expose a portion of the first semiconductor layer. After removing the at least a portion of the second semiconductor layer, the first semiconductor layer has a fourth stress, the fourth stress having a fourth magnitude and a fourth type, and the fourth type is opposite the second type.

In one embodiment of the first aspect, forming the second semiconductor layer includes forming the second semiconductor layer immediately adjacent to the first semiconductor layer. In another embodiment, forming the second semiconductor layer includes selectively forming the second semiconductor layer over only a portion of the first semiconductor layer. In a particular embodiment, annealing the workpiece includes annealing the workpiece on only a portion of the workpiece. In a more particular embodiment, annealing the workpiece on only a portion of the workpiece includes laser annealing only a portion of the workpiece.

In another embodiment of the first aspect, annealing the workpiece includes annealing the workpiece such that the first semiconductor layer has a substantially same material composition before and after annealing the workpiece. Annealing the workpiece also includes annealing the workpiece such that the second semiconductor layer has a substantially same material composition before and after annealing the workpiece. In still another embodiment, forming the second semiconductor layer includes epitaxially growing a layer that includes silicon and germanium. In yet another embodiment, the second semiconductor layer has a thickness not greater than approximately 110 nm.

In another embodiment of the first aspect, the fourth type is tensile. In still another embodiment, each of the first magnitude and the third magnitude is less than approximately 10 MPa.

In a second aspect, a process of forming an electronic device can include providing a workpiece, wherein the workpiece includes a first semiconductor layer, an insulating layer, and a base layer. The insulating layer lies between the first semiconductor layer and the base layer, and the first semiconductor layer has a first stress, the first stress having a first magnitude and a first type. The process can further include annealing the workpiece such that the first semiconductor layer has a second stress, the second stress having a second magnitude and a second type, wherein the second magnitude is different than the first magnitude. The process can further include forming a second semiconductor layer overlying the first semiconductor layer, wherein the second semiconductor layer has a third stress the third stress having a third magnitude and a third type, and the third type is different from the first type.

In one embodiment of the second aspect, the first type is compressive. In another embodiment, the second magnitude is less than 10 MPa. In still another embodiment, forming the second semiconductor layer includes epitaxially growing a silicon layer. In yet another embodiment, after annealing the workpiece, the first semiconductor layer has substantially a same composition as before annealing the workpiece.

In another embodiment of the second aspect, providing a workpiece can further include providing a workpiece, wherein the workpiece includes a third semiconductor layer. The insulating layer can lie between the third semiconductor layer and the base layer. The third semiconductor has a fourth stress, the fourth stress having a fourth magnitude and a fourth type, and the fourth magnitude is less than approximately 10 MPa. The process can further include forming a fourth semiconductor layer over the third semiconductor layer wherein the fourth semiconductor layer includes a first element. The process can also include increasing the concentration of the first element within the third semiconductor layer to form the first semiconductor layer. The process can further include removing the fourth semiconductor layer to expose the first semiconductor layer, wherein the first layer has the first stress.

In another embodiment of the second aspect, the first semiconductor layer can include a first semiconductor material and the first semiconductor material has a spatial ordering of a different dimension from monocrystaline silicon when the spatial ordering of each of the first semiconductor material and the monocrystalline silicon is measured at a substantially same temperature and under a substantially same combination of externally applied forces.

In a third aspect, an electronic device can include a first region that includes a first portion of a base layer. The electronic device can also include a first portion of an insulating layer overlying the first portion of the base layer. The electronic device can further include a first electronic component that includes a first active region can include a first portion of a first semiconductor layer and a first portion of a second semiconductor layer, wherein the first semiconductor layer has a different composition and a different stress compared to the second semiconductor layer. The electronic device can also include a second region that includes a second portion of the base layer. The electronic device can further include a second portion of the insulating layer overlying the second portion of the semiconductor base layer. The electronic device can still further include a second electronic component that includes a second active region can include a second portion of the first semiconductor layer but does not include any portion of the second semiconductor layer.

In one embodiment of the third aspect, the first portion of the first semiconductor layer includes a buried channel region for an electronic component of the electronic device. In another embodiment, only one of the first or the second semiconductor layer includes tensile, monocrystaline silicon.

To the extent not described herein, many details regarding specific materials, processing acts, and circuits are conventional and may be found in textbooks and other sources within the semiconductor and microelectronic arts. Other features and advantages of the invention will be apparent from the following detailed description, and from the claims.

Note that not all of the activities described above in the general description or the examples are required, that a portion of a specific activity may not be required, and that one or more further activities may be performed in addition to those described. Still further, the order in which activities are listed are not necessarily the order in which they are performed. After reading this specification, skilled artisans will be capable of determining which one or more activities or one or more portions thereof are used or not used and the order of such activities are to be performed for their specific needs or desires.

Any one or more benefits, one or more other advantages, one or more solutions to one or more problems, or any combination thereof have been described above with regard to one or more specific embodiments. However, the benefit(s), advantage(s), solution(s) to problem(s), or any element(s) that may cause any benefit, advantage, or solution to occur or become more pronounced is not to be construed as a critical, required, or essential feature or element of any or all the claims.

The above-disclosed subject matter is to be considered illustrative, and not restrictive, and the appended claims are intended to cover all such modifications, enhancements, and other embodiments that fall within the scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A process of forming an electronic device comprising:
   providing a workpiece, wherein:
      the workpiece includes a first semiconductor layer, an insulating layer, and a base layer;
      the insulating layer lies between the first semiconductor layer and the base layer, and
      the first semiconductor layer has a first stress, the first stress having a first magnitude and a first type;
   forming a second semiconductor layer over the first semiconductor layer, wherein the second semiconductor layer has a second stress, the second stress having a second magnitude and a second type;
   annealing the workpiece such that the second semiconductor layer has a third stress, the third stress having a third magnitude and a third type, wherein the third magnitude is different than the second magnitude; and
   removing at least a portion of the second semiconductor layer to expose a portion of the first semiconductor layer, wherein after removing the at least a portion of the second semiconductor layer, the first semiconductor layer has a fourth stress, the fourth stress having a fourth magnitude and a fourth type, and the fourth type is opposite the second type.

2. The process of claim 1, wherein forming the second semiconductor layer comprises forming the second semiconductor layer immediately adjacent to the first semiconductor layer.

3. The process of claim 2, wherein forming the second semiconductor layer comprises selectively forming the second semiconductor layer over only a portion of the first semiconductor layer.

4. The process of claim 1, wherein annealing the workpiece comprises annealing the workpiece on only a portion of the workpiece.

5. The process of claim 4, wherein annealing the workpiece on only a portion of the workpiece comprises laser annealing only a portion of the workpiece.

6. The process of claim 1, wherein annealing the workpiece comprises annealing the workpiece such that:
   the first semiconductor layer has a substantially same material composition before and after annealing the workpiece; and
   the second semiconductor layer has a substantially same material composition before and after annealing the workpiece.

7. The process of claim 1, wherein forming the second semiconductor layer comprises epitaxially growing a layer that includes silicon and germanium.

8. The process of claim 1, wherein the second semiconductor layer has a thickness not greater than approximately 110 nm.

9. The process of claim 1, wherein the fourth type is tensile.

10. The process of claim 1, wherein each of the first magnitude and the third magnitude is less than approximately 10 MPa.

11. The process of claim 1, wherein providing a workpiece further comprises:
    providing a workpiece, wherein:
       the workpiece includes a third semiconductor layer;
       the insulating layer lies between the third semiconductor layer and the base layer,
       the third semiconductor has a fourth stress, the fifth stress having a fifth magnitude and a fifth type, and
       the fourth magnitude is less than approximately 10 MPa;
    forming a fourth semiconductor layer over the third semiconductor layer wherein the fourth semiconductor layer includes a first element;
    increasing the concentration of the first element within the third semiconductor layer to form the first semiconductor layer; and
    removing the fourth semiconductor layer to expose the first semiconductor layer, wherein the first layer has the first stress.

12. The process of claim 1, wherein the first semiconductor layer comprises a first semiconductor material and the first semiconductor material has a spatial ordering of a different dimension from monocrystalline silicon when the spatial ordering of each of the first semiconductor material and the monocrystalline silicon is measured at a substantially same temperature and under a substantially same combination of externally applied forces.

13. The process of claim 1, wherein the first semiconductor layer and the second semiconductor layer comprise different semiconductor element compositions.

14. The process of claim 1, wherein the first semiconductor layer has a first semiconductor element composition, and the second semiconductor layer has a second semiconductor element composition different from the first semiconductor element composition.

15. The process claims of claim 1, wherein the first semiconductor layer comprises monocrystalline silicon, and the second semiconductor layer comprises $Si_{(x)}Ge_{(1-x)}$, wherein x is in a range of approximately 0.1 to less than 1.0.

16. The process claims of claim 1, wherein the first semiconductor layer comprises $Si_{(x)}Ge_{(1-x)}$, wherein x is in a range of approximately 0.1 to less than 1.0, and the second semiconductor layer comprises monocrystalline silicon.

17. The process claims of claim 1, wherein the first semiconductor layer comprises $Si_{(x)}C_{(1-x)}$, wherein x is in a range of approximately 0.1 to less than 1.0.

18. The process claims of claim 1, wherein the second semiconductor layer comprises $Si_{(x)}C_{(1-x)}$, wherein x is in a range of approximately 0.1 to less than 1.0.

19. The process of claim 11, wherein the first semiconductor layer has a first semiconductor element composition, the third semiconductor layer has a second semiconductor element composition different from the first semiconductor element composition, and the fourth semiconductor layer has a third semiconductor element composition different from each of the first and second semiconductor element compositions.

20. The process of claim 11, wherein providing the workpiece including the third semiconductor layer, forming the fourth semiconductor layer, increasing the concentration of the first element within the third semiconductor layer to form the first semiconductor layer; and removing the fourth semiconductor layer are performed before forming the second semiconductor layer.

* * * * *